(12) United States Patent
Cornelius

(10) Patent No.: US 6,734,811 B1
(45) Date of Patent: May 11, 2004

(54) SINGLE-ENDED BALANCE-CODED INTERFACE WITH EMBEDDED-TIMING

(75) Inventor: William Cornelius, Los Gatos, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 10/443,547

(22) Filed: May 21, 2003

(51) Int. Cl.$^7$ ................................................ H03M 5/00
(52) U.S. Cl. ............................. 341/58; 341/60; 341/59; 341/102
(58) Field of Search ........................... 341/102, 58, 59, 341/60, 51, 52, 81

(56) References Cited

U.S. PATENT DOCUMENTS

| | | | | |
|---|---|---|---|---|
| 5,625,644 A | * | 4/1997 | Myers | ........................ 375/242 |
| 6,151,334 A | * | 11/2000 | Kim et al. | ................... 370/468 |
| 6,295,010 B1 | * | 9/2001 | Thiesfeld | ..................... 341/58 |
| 6,477,502 B1 | * | 11/2002 | Ananthpadmanabhan et al. | ........................ 704/503 |

* cited by examiner

*Primary Examiner*—Brian Young
*Assistant Examiner*—John Nguyen
(74) *Attorney, Agent, or Firm*—Blakely, Sokoloff, Taylor & Zafman LLP

(57) ABSTRACT

An interface includes an encoder to receive a stream of input symbols and, in response, to output a corresponding stream of output symbols of substantially equal weight via multiple signal lines, which can improve noise/speed performance. The encoder outputs the stream of output symbols so that no output symbol is consecutively repeated. A repeat symbol is used to indicate that the current symbol is identical to the immediately preceding symbol. This encoding allows an interface receiving the stream of output symbols can extract a clock signal from the stream.

41 Claims, 8 Drawing Sheets

EXAMPLE SYMBOL ASSIGNMENT
FOR DRAM APPLICATIONS

| SYMBOL | CODE | DEFINITION |
|--------|--------|------------|
| 1 | 000111 | 0000 |
| 2 | 001011 | 0001 |
| 3 | 001101 | 0010 |
| 4 | 001110 | 0011 |
| 5 | 010011 | 0100 |
| 6 | 010101 | 0101 |
| 7 | 010110 | 0110 |
| 8 | 011001 | 0111 |
| 9 | 011010 | 1000 |
| 10 | 011100 | 1001 |
| 11 | 100011 | 1010 |
| 12 | 100101 | 1011 |
| 13 | 100110 | 1100 |
| 14 | 101001 | 1101 |
| 15 | 101010 | 1110 |
| 16 | 101100 | 1111 |
| 17 | 110001 | REPEAT |
| 18 | 110010 | MASK |
| 19 | 110100 | CNTL START |
| 20 | 111000 | CNTL END |

*Fig. 4*

| SYMBOL | SYMBOL CODE | DEFINITION |
|---|---|---|
| 1 | 000111 | 0000 |
| 2 | 001011 | 0001 |
| 3 | 001101 | 0010 |
| 4 | 001110 | 0011 |
| 5 | 010011 | CNTL START |
| 6 | 010101 | 0100 |
| 7 | 010110 | 0101 |
| 8 | 011001 | 0110 |
| 9 | 011010 | 0111 |
| 10 | 011100 | REPEAT |
| 11 | 100011 | MASK |
| 12 | 100101 | 1000 |
| 13 | 100110 | 1001 |
| 14 | 101001 | 1010 |
| 15 | 101010 | 1011 |
| 16 | 101100 | CNTL STOP |
| 17 | 110001 | 1100 |
| 18 | 110010 | 1101 |
| 19 | 110100 | 1110 |
| 20 | 111000 | 1111 |

*Fig. 4A*

| SYMBOL | SYMBOL CODE | DEFINITION |
|---|---|---|
| 1 | 000111 | 0000 |
| 2 | 001011 | 0001 |
| 3 | 001101 | 0010 |
| 4 | 001110 | 0011 |
| 5 | 010011 | CNTL START |
| 6 | 010101 | REPEAT |
| 7 | 010110 | 0100 |
| 8 | 011001 | 0101 |
| 9 | 011010 | 0110 |
| 10 | 011100 | 0111 |
| 11 | 100011 | 1000 |
| 12 | 100101 | 1001 |
| 13 | 100110 | 1010 |
| 14 | 101001 | 1011 |
| 15 | 101010 | MASK |
| 16 | 101100 | CNTL STOP |
| 17 | 110001 | 1100 |
| 18 | 110010 | 1101 |
| 19 | 110100 | 1110 |
| 20 | 111000 | 1111 |

*Fig. 4B*

SINGLE-ENDED BALANCE-CODED INTERFACE WITH EMBEDDED-TIMING

FIELD OF THE INVENTION

Embodiments of invention relate generally to bus interfaces and, more specifically but not exclusively relate to encoded bus interfaces.

BACKGROUND INFORMATION

Modern bus systems for use in high-performance systems (e.g., a processor system) can operate at 400 MHz or more. Such high-speed systems can be susceptible to noise (e.g., supply noise due to switching of the circuits used to drive signals on the bus lines).

One solution is to use differential signaling schemes that help reduce sensitivity to common mode noise on the signal lines. However, differential signaling schemes have the disadvantage of doubling the number of signal lines and transceivers compared to single-ended schemes. Thus, for some applications, differential signaling may be undesirable. For example, some modern buses are 64-bits wide for data, thereby requiring 128 data signal lines. This relatively large number of data signal lines (and the associated transceivers) occupies valuable area on the chip(s) and wiring substrate (e.g., motherboard), which tends to increase the cost and complexity of the system.

On the other hand, if single-ended signal lines are used, in addition to the aforementioned noise sensitivity, the bus interfaces driving the signals on the signal lines can be "unbalanced". That is, the number of logic low signals and logic high signals during a clock cycle may be different, resulting in a local net current flow in or out of a bus interface. This current flow can undesirably cause localized power supply noise (including simultaneously switching output (SSO) noise).

SUMMARY OF THE INVENTION

In accordance with aspects of embodiments of the present invention, an interface includes an encoder to receive a stream of input symbols and, in response, to output a corresponding stream of output symbols of substantially equal weight via multiple signal lines. In this context, a symbol refers to value of a preselected set of bits propagated on a selected set of signal lines. This balance-coded interface allows for relatively fast bus frequency with relatively low simultaneous switching output (SSO) noise.

In accordance with another aspect of embodiments of the present invention, an interface receiving the stream of output symbols can extract a clock signal from the stream. In this aspect, the encoder outputs the stream of output symbols so that no output symbol is consecutively repeated. In one embodiment, a repeat symbol is used to indicate that the current symbol is identical to the immediately preceding symbol. Thus, because no two consecutive output symbols are repeated, the receiving interface will be able to detect a signal transition on at least one of the signal lines. The receiving interface can use the detected transitions to generate a clock signal.

In still another aspect of the present invention, the encoder can output a MASK symbol to indicate that data is masked. This aspect can be advantageously used in memory applications, which typically define a mask bit in the interface.

In yet another aspect of the present invention, the interface can use symbols that are not used for data or mask symbols for command/control purposes. For example, in one embodiment, these "spare" symbols can be used to configure interconnect devices such as multiplexers and interleavers.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4 is a diagram illustrating symbol assignments for the 4-bit/6-bit balance-coded embedded-timing interface of FIG. 3, according to one embodiment of the present invention.

DETAILED DESCRIPTION OF PREFERRED EMBODIMENTS

Figure 1:
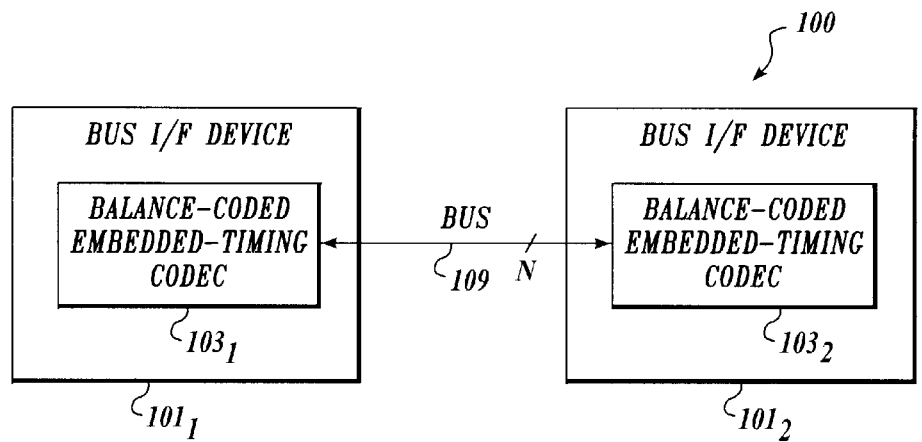
FIGS. 1–1B are block diagrams illustrating exemplary systems that include a balance-coded embedded-timing interface according to an embodiment of the present invention.

FIG. 1 illustrates an exemplary system 100 with "generic" bus interface devices $101_1$ and $101_2$ having balance-coded embedded-timing coder/decoder (CODEC) $103_1$ and CODEC $103_2$, respectively. Bus interface devices $101_1$ and $101_2$ are coupled to a bus 109 having a data width of N bits. In this embodiment, system 100 supports bi-directional traffic on bus 109. Bus 109 can be a terminated bus. In addition, in other embodiments, bus 109 may have additional lines for addressing and/or control so that the total width of bus 109 exceeds N bits. These additional lines need not be encoded.

CODECs $103_1$ and $103_2$ are each configured to encode a received stream of M-bit data symbols into N-bit data symbols to be transmitted onto bus 109, with N being greater than M. For reasons described below, N is constrained to be even in this embodiment. For example, in one embodiment, N is six and M is four (i.e., 4b–6b nibble encoding). In other embodiments, M is a multiple of four (corresponding to bytes or words) and N is the same multiple of six. In still other embodiments, M and N need not be multiples of four and six. CODECs $103_1$ and $103_2$ are also configured to decode a received stream of N-bit data symbols received via bus 109 into corresponding M-bit data symbols. One example of 4b–6b encoding is summarized in the table of FIG. 4, described below.

In addition, in accordance with embodiments of the invention, CODEC $103_1$ encodes each M-bit input data symbol into an N-bit output data symbol with equal numbers of logic high and logic low bits. Symbols having equal numbers of logic high and logic low bits are referred to herein as being balanced. This balanced-coding achieves a relatively low local SSO noise level compared to typical unbalanced signaling used in some conventional interfaces. As a result, the interface can be operated at a relatively high rate (e.g., similar to the rates achievable in differential signaling) using about half the number signal lines.

In a further refinement, the CODECs can be configured so that one of the "spare" N-bit symbols (i.e., a symbol not needed to define a M-bit data symbol) is used as a "REPEAT" symbol. This N-bit REPEAT symbol is used when a current M-bit data symbol to be encoded is identical to the previously encoded symbol. Thus, if a CODEC consecutively receives two identical L-bit data symbols, the CODEC will encode first M-bit data symbol into the corresponding N-bit data symbol and the second M-bit data symbol into the REPEAT symbol. Consequently, the logic level of a signal on at least one signal line of bus 109 will transition with every transmitted symbol. The receiving interface device can be configured to generate a timing signal from the data lines of bus 109, using a transition on any of the data lines to toggle the timing signal. Thus, this embodiment advantageously eliminates the need for a signal line dedicated for timing signal, thereby reducing the number of signal lines needed in bus 109 (two lines if the bus is differential). In addition, this timing signal is generated locally, thereby advantageously reducing skew compared to conventional timing systems that use global timing signals.

In the case of a third consecutive identical M-bit symbol being received by the CODEC, the CODEC would encode the M-bit into the corresponding N-bit symbol (as is the case with the first M-bit signal of the sequence). Therefore, the third N-bit symbol is again different from the preceding symbol, causing at least one logic level transition on bus 109 (so that the timing signal can be extracted).

Figure 1A:
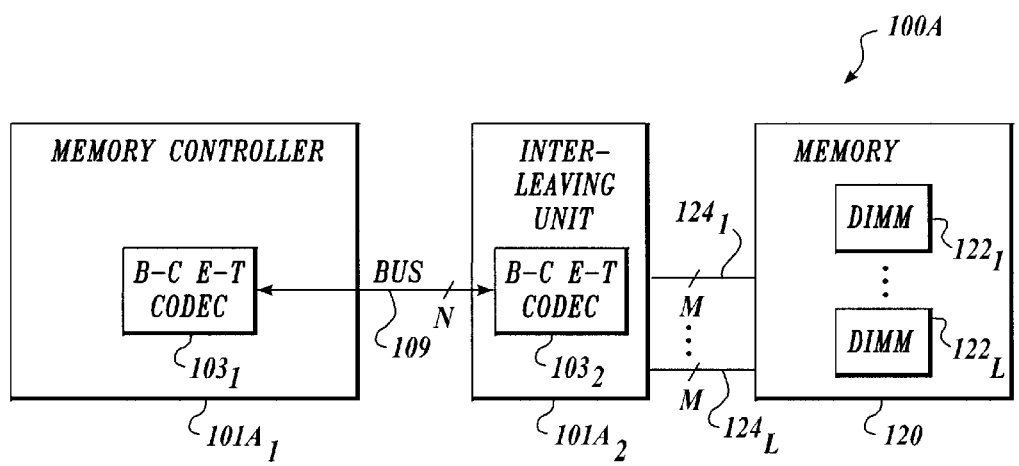

FIG. 1A illustrates an exemplary memory system 100A with a memory controller $101A_1$ (that includes CODEC $103_1$), an interleaving unit $101A_2$ (that includes CODEC $103_2$) and a memory 120 having dual in-line memory modules (DIMMs) $122_1$ through $122_L$.

The elements of memory system 100A are interconnected as follows. CODEC $103_1$ of memory controller $101A_1$ and CODEC $103_2$ of interleaving unit $101A_2$ are connected to N-bit bus 109. Interleaving unit $101A_2$ is connected to DIMMS $122_1$ through $122_L$ of memory 120 via buses $124_1$ through $124_L$ respectively. In this embodiment, buses $124_1$ through $124_L$ are "non-encoded" single-ended buses, each being M-bits wide, as used in a typical conventional memory system.

This embodiment of memory system 100A operates as follows. To write data to memory 120, CODEC $103_1$ receives a stream M-bit data symbols from a data source (not shown) and encodes them into a stream of N-bit data symbols (as described above in conjunction with FIG. 1). Memory controller $101A_1$ transmits the N-bit data symbols to interleaving unit $101A_2$ via bus 109. In one embodiment, bus 109 operates at a frequency that is L times the operating frequency of buses $124_1$ through $124_L$. Because this is a point-to-point connection (no stubs), bus 109 is not restricted to industry standard memory speeds. For example, bus 109 can be operated at a relatively high rate compared to those conventional buses that have a load of L DIMMs. In this way, for each memory cycle (i.e., at the memory speed) on buses $124_1$ through $124_L$, memory controller $101A_1$ can access each of DIMMs $122_1$ through $122_L$ via interleaving unit $101A_2$.

For example, in one embodiment, memory controller $101A_1$ is configured to transmit L N-bit data symbols to interleaving unit $101A_2$, where each of the L N-bit data symbols are to be written into a corresponding DIMM of DIMMs $122_1$ through $122_L$ of memory 120. Memory controller $101A_1$ can transmit these L N-bit data symbols to interleaving unit $101A_2$ during one memory cycle of memory 120. CODEC $103_2$ of interleaving unit $101A_2$ decodes the L N-bit data symbols into L M-bit data symbols. Interleaving unit $101A_2$ then outputs each decoded M-bit data symbol onto the corresponding bus of buses $124_1$ through $124_L$. In one embodiment, interleaving unit $101A_2$ can latch the L M-bit data symbols onto buses $124_1$ through $124_L$ so that memory 120 can store the data from buses $124_1$ through $124_L$ in DIMMs $122_1$ through $122_L$, respectively.

To read data, memory 120 causes a M-bit data symbol from each of DIMMS $122_1$ through $122_L$ to be output on buses $124_1$ through $124_L$, respectively, during a memory cycle. Interleaving unit $101A_2$ receives these L M-bit data symbols on buses $124_1$ through $124_L$. CODEC $103_2$ encodes the L M-bit data symbols into L N-bit data symbols. In the duration of one memory cycle, interleaving unit $101A_2$ serially transmits the L N-bit data symbols to memory controller $101A_1$ via bus 109. As previously stated, in one embodiment bus 109 operates at L times the rate of buses $124_1$ through $124_L$.

In a further refinement, one or more "spare" N-bit symbols (i.e., not assigned as a data symbol corresponding to a L-bit data symbol) can be used to configure interleaving unit $101A_2$. For example, memory controller $101A_1$ can send an N-bit symbol that represents a command to configure interleaving unit $101A_2$ to operate with K DIMMs of L possible DIMMs that are installed as part of memory 120. Other examples include using N-bit symbol(s) to configure interleaving unit $101A_2$ for calibration control, timing control, driver control, receiver control, etc. In other embodiments, spare symbols can be defined as command delimiter symbols so that symbols that would normally be used as data symbols are defined as control or configuration symbols when transmitted between the command delimiter symbols.

In another embodiment, memory 120 can be logically divided into P sections with L/P DIMMs in each section. In this embodiment, interleaving unit $101A_2$ can function in part as a multiplexer so that a selected section can be interleaved. For example, in one embodiment, L can be eight and P can be two. Therefore, there are four DIMMs per section and, in this example, bus 109 is operated at four times the rate of buses $124_1$ through $124_L$ to achieve "4×" interleaving. For example, to write data into the section that contains DIMMs $122_1$ through $122_4$, memory controller $101A_1$ can cause interleaving unit $101A_2$ to select buses $124_1$ through $124_4$ (as in a multiplexer) and then interleave four N-bit data symbols received from memory controller $101A_1$ to DIMMs $122_1$ through $122_4$ in a manner as described above.

Figure 1B:
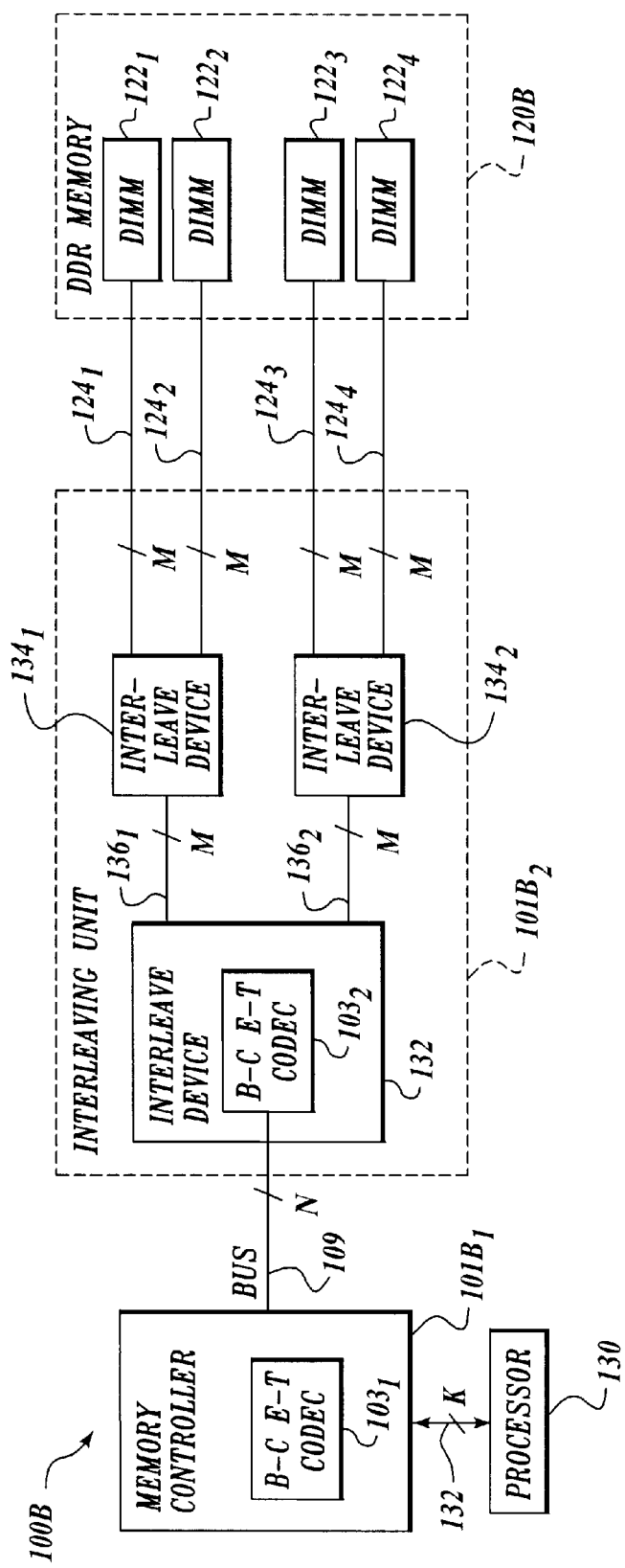

FIG. 1B illustrates an exemplary computer system 100B that includes a processor 130, a memory controller $101B_1$ (that includes CODEC $103_1$), an interleaving unit $101B_2$, and a double data rate (DDR) memory 120B having four DIMMS $122_1$ through $122_4$. Interleaving unit $101B_2$ includes an interleaving device 132 (that includes CODEC $103_2$) and interleaving devices $134_1$ and $134_2$. In other embodiments, a single unit can provide the same interleaving functionality.

In this embodiment, processor 130 communicates with memory controller $101B_1$ via a bus 132 having a data word width of K bits. Memory controller $101B_1$ communicates with interleaving unit $101B_2$ via bus 109, which in turn communicates with memory 120B via buses $124_1$ through $124_4$. In this embodiment, interleaving unit $101B_2$ communicates with DIMMs $122_1$ and $122_2$ of memory 120 via interleave devices 132 and $134_1$ and buses $136_1$, $124_1$ and $124_2$. Similarly, interleaving unit $101B_1$ communicates with DIMMs $122_3$ and $122_4$ of memory 120 via interleave devices 132 and $134_2$ and buses $136_2$, $124_3$ and $124_4$. The operation of computer system 100B is described below in conjunction with FIG. 2.

Figure 2:
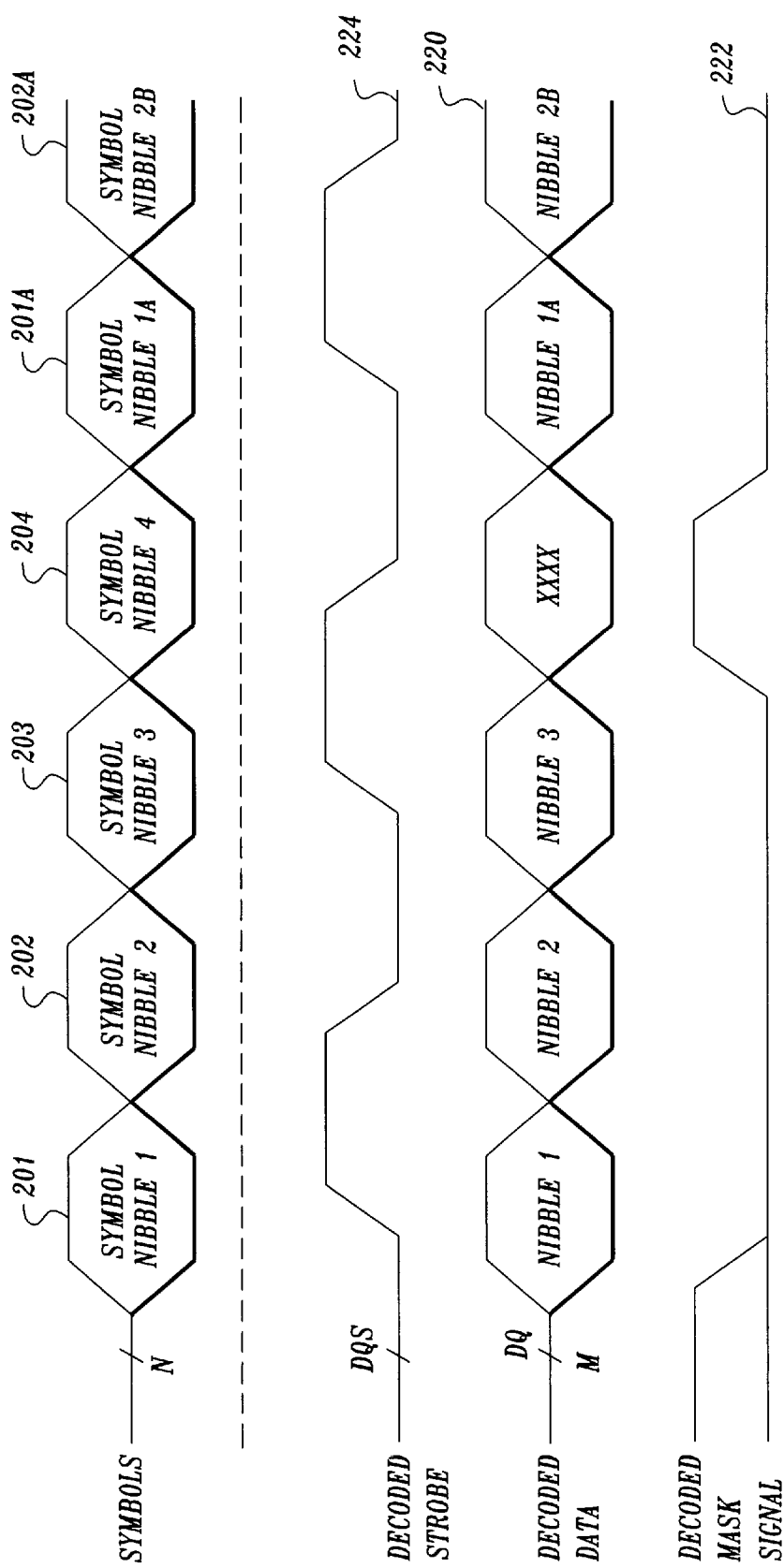
FIG. 2 is a diagram illustrating the pertinent timing of the interface depicted in FIG. 1B, according to one embodiment of the present invention.

FIG. 2 illustrates the timing of bus 109 (FIG. 1B) in transferring data between memory controller $101B_1$ (FIG. 1B) and interleaving unit $101B_2$ (FIG. 1B), according to one embodiment of the present invention. Referring to FIGS. 1B and 2, memory 120B can be accessed as follows.

In one embodiment, a word of data is 4×M bits wide (i.e., K=4M) so that each data word has four M-bit symbols. For example, M can be a nibble wide (e.g., 4-bits), so that K is 16-bits. With M=4, N is selected to be six in this example. With N=6, there are 20 balanced N-bit symbols, enough to represent all possible values of a nibble, with four extra balanced symbols for other purposes (e.g., REPEAT, MASK, etc. symbols). One implementation of such a 4-bit/6-bit scheme is described in more detail in conjunction with FIG. 3 below.

In this example, the K-bit data word has four M-bit symbols indicated as nibble 1 through nibble 4 in FIG. 2, where nibble 1 has the same value as nibble 2. Further, in this example, the last M-bit symbol (i.e., nibble 4) is to be masked. Although a 16-bit word/bus width and 4-bit/6-bit symbol encoding are used in this embodiment, other embodiments may have a different combination of word sizes, symbol (both M-bit and N-bit) sizes, and bus widths. For example, a 16-bit word/bus length and 8-bit/11-bit symbol encoding can be used in another embodiment to reduce the number of lines (i.e., 22 lines for 8-bit/11-bit encoding vs. 24 lines for 4-bit/6-bit encoding).

CODEC $103_1$ receives the "first" K-bit data word and sequentially outputs four N-bit data symbols, with each N-bit data symbol representing a M-bit nibble of the K-bit data word. These N-bit symbols are shown as symbols 201–204 in FIG. 2, corresponding to nibble 1 through nibble 4 of the K-bit data word. As previously described, CODEC $103_1$ outputs the N-bit symbols as balanced symbols. In addition, as previously described, CODEC $103_1$ outputs these symbols so that no symbol is consecutively repeated. Thus, symbol 201 is the N-bit symbol corresponding to M-bit nibble 1, while symbols 203 and 204 are the N-bit symbols corresponding to M-bit nibbles 3 and 4. In this example, the M-bit nibble corresponding to N-bit symbol 202 has the same value as that of the nibble corresponding to symbol 201; thus, in accordance with this embodiment of the invention, symbol 202 is a REPEAT symbol. As previously described, the REPEAT symbol indicates that its corresponding nibble is the same as the previous nibble (i.e., nibble 1 in this example).

Similarly, when CODEC $103_1$ receives the four M-bit symbols (i.e., nibbles in this example) of the next data word via bus 132 from processor 130, CODEC $103_1$ outputs corresponding N-bit symbols 201A, 202A, and so on.

Memory controller $101B_1$ outputs the N-bit symbols from CODEC $103_1$ to interleaving unit $101B_2$. CODEC $103_2$ of interleaving unit $101B_2$ then decodes the N-bit symbols from memory controller $101B_1$ into M-bit symbols (i.e., 4-bit nibbles in this example). In this example, CODEC $103_2$ decodes: N-bit symbol 201 into M-bit nibble 1; N-bit symbol 202 (i.e., the REPEAT symbol) into M-bit nibble 2 identical to nibble 1; N-bit symbol 203 into M-bit nibble 3; and N-bit symbol 204 (i.e., the MASK symbol) into any nibble value (i.e., don't care bits). In one embodiment, the don't care bits are output as logic low bits. The decoded data symbols are shown as a waveform 220 in FIG. 2.

In addition, in decoding the MASK symbol 204, CODEC $103_2$ asserts the MASK signal that is part of the interface of DDR memory 120B. The MASK signal is shown as a waveform 222 in FIG. 2.

In this embodiment, decoding the N-bit symbols also includes CODEC $103_2$ generating a timing signal (i.e., a strobe signal in this example that is part of the interface of DDR memory 120B) from the received symbols. In this embodiment, each symbol causes a transition in the timing signal. CODEC $103_2$ can generate the timing signal from the received symbols because, as previously described, no two consecutively transmitted symbols are identical. Thus, at least one bit between consecutively transmitted symbols transitions. CODEC $103_2$ detects the bit transition(s) between symbols and uses the detected transitions to cause transitions in the timing signal. For example, in one embodiment, CODEC $103_2$ can include transition detector logic (e.g., see FIG. 5) that performs an XOR operation on the current symbol and the previous symbol to drive a flip-flop used in generating the timing signal. Any suitable transition detection circuitry can be used in other embodiments, including indirect timing generation using phase locked loop (PLL) circuits, delay locked loop (DLL) circuits, etc. The timing signal is shown as a waveform 224 in FIG. 2.

In this embodiment, interleaving device 132 of interleaving unit $101B_2$ then provides the decoded M-bit symbols, MASK and timing signals to interleave devices $134_1$ and $134_2$ via buses $136_1$ and $136_2$, respectively. For example, in one embodiment, interleave device 132 is configured to provide: (a) the MASK signal, the timing signal, and the first and second decoded M-bit symbols of a data word to interleave device $134_1$; and (b) the MASK signal, the timing signal, and the third and fourth M-bit symbols of that data word to interleave device $134_2$. In a standard parallel interface, the MASK, timing and data signals would be appropriately timed on bus $136_1$.

In turn, interleave device $134_1$ is configured to provide over a standard parallel interface: (c) the received MASK signal, timing signal, and first M-bit symbol to DIMM $122_1$ via bus $124_1$; and (d) the received MASK signal, timing signal, and second M-bit symbol to DIMM $122_2$ via bus $124_2$. Similarly, interleave device $134_2$ is configured to provide: (e) the received MASK signal, timing signal, and third M-bit symbol to DIMM $122_3$ via bus $124_3$; and (f) the received MASK signal, timing signal, and fourth M-bit symbol to DIMM $122_4$ via bus $1243_4$.

When reading a data word from memory 120B, each of DIMMs $122_1$–$122_4$ outputs its corresponding M-bit symbol of the addressed data word to interleaving unit $101B_2$. Interleave devices $134_1$ and $134_2$ provide the M-bit symbols received from DIMMs $122_1$–$122_4$ to interleave device 132. Interleave device 132 then encodes the received M-bit symbols to N-bit symbols, which are then output to memory controller $101B_1$ via bus 109. Memory controller 101B1 then decodes the received N-bit symbols back to M-bit symbols, which can then be concatenated into a data word and outputted to processor 130 via bus 132.

Figure 3:
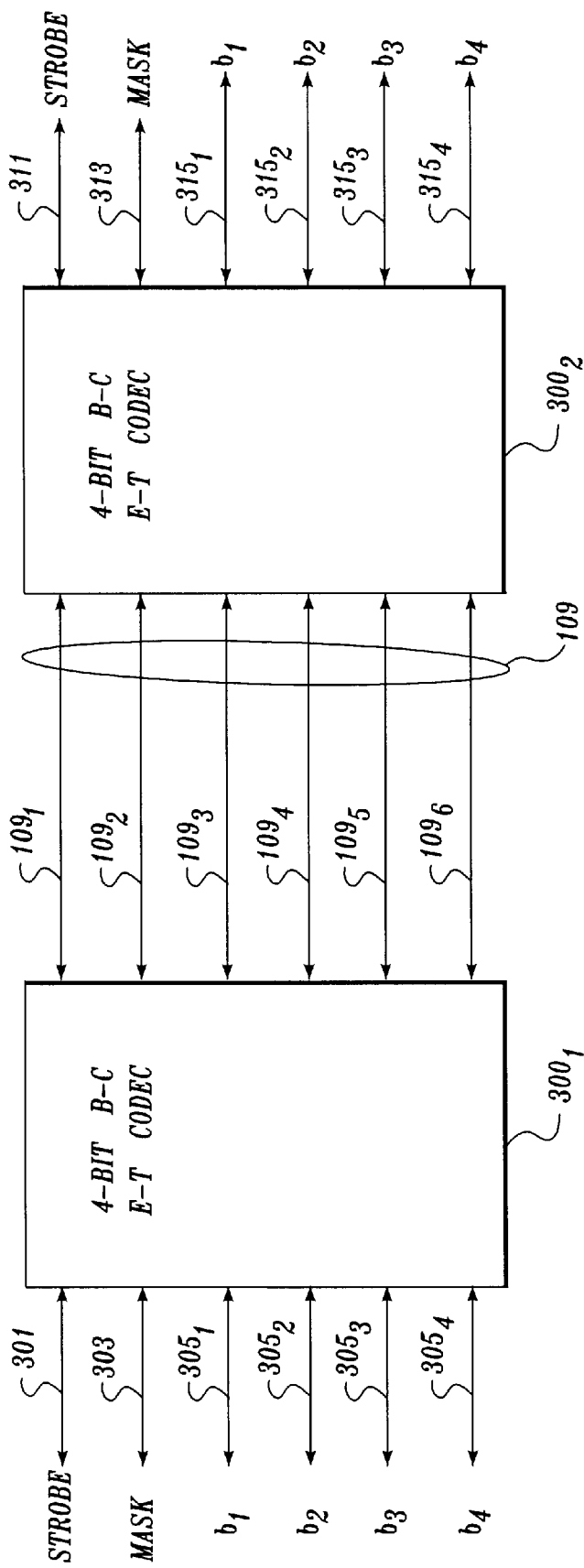
FIG. 3 is a diagram illustrating a 4-bit/6-bit balance-coded embedded-timing interface, according to an embodiment of the present invention.

FIG. 3 illustrates a 4-bit/6-bit balance-coded embedded-timing interface, according to an embodiment of the present invention. CODECs $300_1$ and $300_2$ are similar to CODECs $103_1$ and $103_2$ (FIG. 1B) except that CODECs $300_1$ and $300_2$ are specifically 4-bit/6-bit CODECs.

In this embodiment, CODEC $300_1$ has a 4-bit data interface that includes a STROBE line 301, a MASK line 303 and data lines $305_1$–$305_4$. In addition, CODEC $300_1$ has a 6-bit data interface to bus 109 that includes lines $109_1$–$109_6$. CODEC $300_2$ also has a 6-bit interface to bus 109 and a 4-bit data interface that includes a STROBE line 311, a MASK line 313 and data lines $315_1$–$315_4$.

CODECs $300_1$ and $300_2$ are each configured to encode received 4-bit data symbols (e.g., nibbles) into balanced 6-bit symbols and to decode received 6-bit symbols into 4-bit data symbols or nibbles. One exemplary encoding scheme is summarized in the table of FIG. 4. As seen in FIG. 4, there are twenty balanced symbols possible using 6-bit symbols. Sixteen of the balanced 6-bit symbols are used for defining 4-bit data symbols, with four extra balanced 6-bit symbols. For example, CODEC $300_1$ can receive 4-bit data symbols via lines $305_1$–$305_4$, where transitions of the signal on STROBE line 301 indicating when to sample the data on lines $305_1$–$305_4$. CODEC $300_1$ would then output the corresponding 6-bit symbol (according to the table of FIG. 4) onto lines $109_1$–$109_6$ to CODEC $300_2$. CODEC $300_2$ can then decode the received 6-bit symbols according to the table of FIG. 4. Data flow in the opposite direction is performed in substantially the same manner except that CODEC $300_2$ performs the encoding and CODEC $300_1$ performs the decoding.

One of the four extra balanced 6-bit symbols is used to define the aforementioned REPEAT symbol. In this embodiment, the REPEAT symbol is used as follows. If a CODEC consecutively receives two 4-bit symbols that are the same, the CODEC will output the REPEAT symbol for the second 4-bit symbol instead of outputting the 4-bit symbol's corresponding 6-bit symbol again. In this way, there will be at least one transition on lines $109_1$–$109_6$, which can be detected by the receiving CODEC to generate a STROBE signal.

In this embodiment, another of the four extra balanced 6-bit symbols is used to define the aforementioned MASK symbol. For example, CODEC $300_1$ outputs the MASK symbol in response to the signal received on MASK line 303. In this embodiment, When the signal on MASK line 303 is asserted, CODEC $300_1$ is configured to ignore the signals on lines $305_1$–$305_4$ and to output the MASK symbol according to the table of FIG. 4. CODEC $300_2$ decodes the received MASK symbol and in response asserts the signal on MASK line 311. The signals on lines $315_1$–$315_4$ may remain the same as in the previous cycle or may be pulled up or down, depending on the design. Data flow in the opposite direction is performed in substantially the same manner except that CODEC $300_2$ performs the encoding and CODEC $300_1$ performs the decoding.

The other two balanced 6-bit symbols are used to define control start and control end delimiters (i.e., CNTL_START and CNTL_END). These delimiters can be used to indicate that symbols received between the delimiters are control symbols. These control symbols can be used to configure devices in the data path (e.g., interleaving devices 132, $134_1$ and $134_2$ in FIG. 1B).

FIG. 4 illustrates symbol assignments for the 4-bit balance-coded embedded-timing interface of FIG. 3, according to one embodiment of the present invention. Other assignments are illustrated in FIGS. 4A and 4B, which are defined so that the logic implementation may be simplified. For example, the definitions in FIGS. 4A and 4B are selected so that the first two bits of the symbol code match the first two bits of the "nibble definitions". In other embodiments, different symbol assignments can be used.

Figure 5:
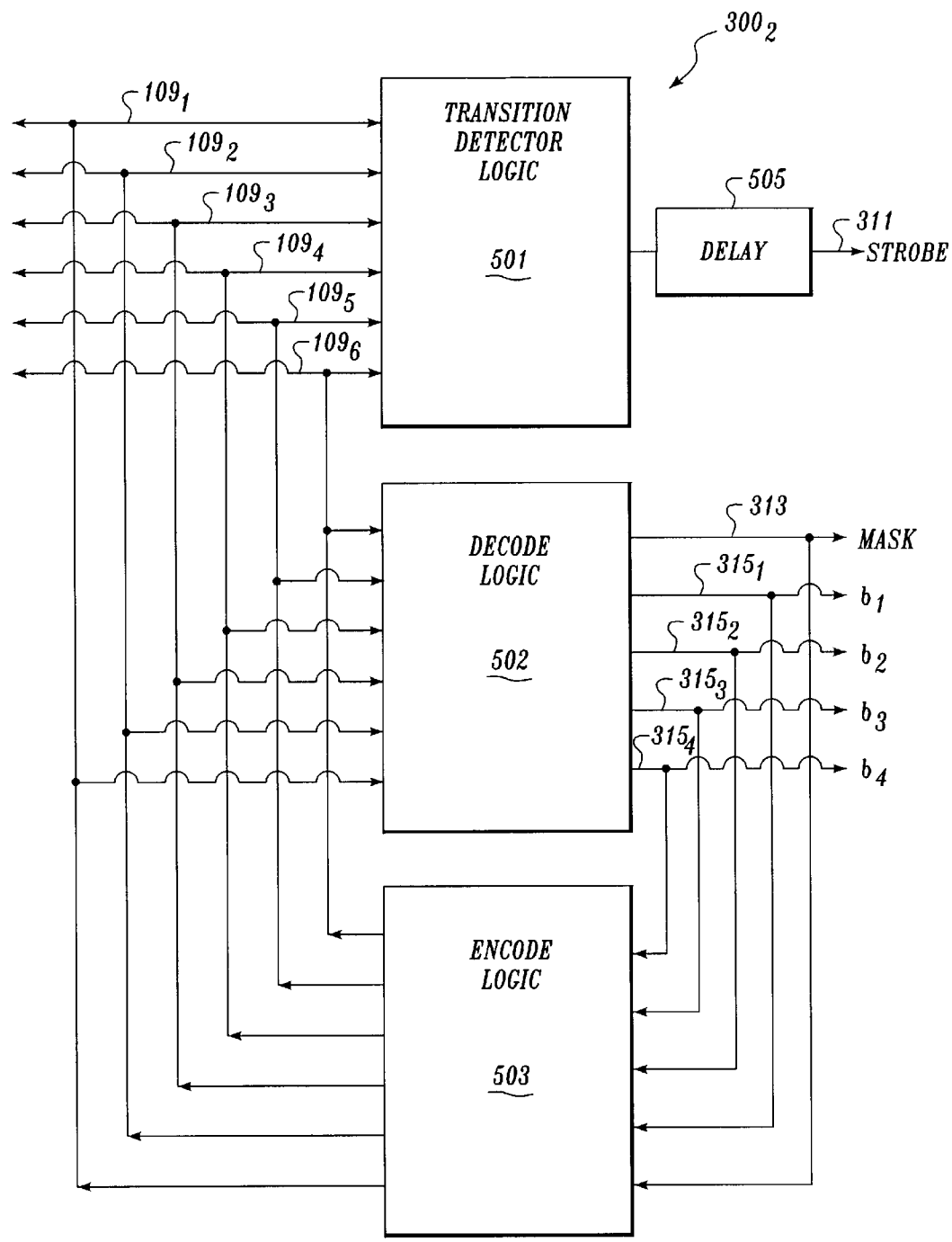
FIG. 5 is a block diagram illustrating one of the 4-bit/6-bit balance-coded embedded-timing codecs of FIG. 3, according to one embodiment of the present invention.

FIG. 5 illustrates CODEC $300_2$ (FIG. 3), according to one embodiment of the present invention. This embodiment includes a symbol transition detector 501, decode logic 502 and encode logic 503. A delay circuit 505 can be included to adjust the phase of the STROBE signal.

Transition detector 501 is connected to receive 6-bit symbols via lines $109_1$–$109_6$. Transition detector 501 has an output line connected to an input lead of delay circuit 505, which has an output lead connected to STOBE line 311. Transition detector 501 can be implemented using any suitable logic to detect a transition on any of lines $109_1$–$109_6$ and generate therefrom a transition on signal being output to delay circuit 505. As previously described, transition detector 501 can include XOR logic to operate on a currently received 6-bit symbol and the previously received 6-bit symbol, with the XOR logic outputting a pulse in response to any transition on lines $109_1$–$109_6$. This pulse is used to clock a flip-flop, which generates the STROBE signal. In one embodiment, because the 6-bit symbols must be balanced, the logic only needs to consider the three of the bits of the symbol that were at "1" and determine whether there was a change. This approach can be less complex to implement.

Decode logic 502 is also connected to receive 6-bit symbols via lines $109_1$–$109_6$. In addition, decode logic 502 has output leads connected to MASK line 313 and to lines $315_1$–$315_4$. Decode logic 502 can be implemented using any suitable logic to implement symbol assignments of the table of FIG. 4.

Encode logic 503 is connected to receive 4-bit data symbols from lines $315_1$–$315_4$ and STROBE and MASK signals via lines 311 and 313. Encode logic 503 can be implemented using any suitable logic to implement symbol assignments of the table of FIG. 4.

In one embodiment, a control signal is asserted to enable transition detector 501 and decode logic 502 while substantially simultaneously disabling encode logic 503 so that CODEC $300_2$ can receive and decode 6-bit symbols from CODEC $300_1$ (FIG. 3). Conversely, when CODEC 3002 is to receive and encode 4-bit data symbols, this control signal can be de-asserted to disable transition detector 501 and decode logic 502 while enabling encode logic 503.

In this embodiment, CODEC $300_1$ (FIG. 3) is implemented in substantially the same way as this embodiment of CODEC $300_2$.

Although balance-coded embodiments are described above, the embedded timing feature can be used in embodiments that do not used balance-coding.

Embodiments of method and apparatus for a balance-coded embedded-timing interface are described herein. In the above description, numerous specific details are set forth (such as the number of bits, the state assignments, etc.) to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring the description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An interface unit, comprising:
a first encoder to receive a stream of input symbols selected from a plurality of input symbols and, in response, to selectively output a corresponding stream of output symbols selected from a plurality of output symbols, each of the plurality of input symbols being associated with a corresponding output symbol of the plurality of output symbols, wherein no two consecutively outputted symbols of the stream of output symbols are identical.

2. The interface unit of claim 1 wherein all of the plurality of output symbols have a balanced weight.

3. The interface unit of claim 1 wherein, in response to consecutively receiving two identical input symbols, the first encoder to consecutively output two output symbols of the plurality of output symbols of which one is an output symbol indicating that the one of the two consecutively received input symbols is identical to the other.

4. The interface unit of claim 1 wherein the plurality of output symbols includes an output symbol that when outputted by the first encoder indicates that an input symbol received by the first encoder during one cycle is identical to another input symbol that was received during an immediately preceding cycle.

5. The interface unit of claim 1 wherein transitions between consecutive output symbols of the stream of output symbols correspond to transitions of a timing signal used to sample the outputted stream of output symbols.

6. The interface unit of claim 1 wherein the plurality of output symbols includes a symbol that when outputted by the first encoder functions as a mask signal.

7. The interface unit of claim 1 further comprising a plurality of output circuits coupled to the first encoder, wherein the plurality of output circuits each output a single-ended signal.

8. The interface unit of claim 1 wherein the first encoder is part of a memory controller.

9. The interface unit of claim 8 wherein the plurality of input symbols corresponds to a portion of a memory data word.

10. The interface unit of claim 9 further comprising a second encoder substantially similar to the first encoder, wherein an output symbol from the first encoder and an output symbol of the second encoder together represent a byte of a memory data word.

11. A method for transmitting data, the method comprising:
receiving a stream of input symbols selected from a plurality of input symbols;
selectively providing an output symbol corresponding to each received input symbol, each output symbol selected from a plurality of output symbols, each input symbol of the plurality of input symbols being represented by an output symbol of the plurality of output symbols;
outputting a stream of the provided output symbols so that no two consecutively outputted symbols are the same.

12. The method of claim 11, wherein the plurality of output symbols are balanced equal weight output symbols.

13. The method of claim 11, wherein outputting a stream of provided output symbols further comprises, selectively outputting two consecutive output symbols in response to a consecutive receiving of two identical input symbols, wherein one of the two consecutive output symbols is a symbol indicating that the one of the two consecutively received input symbols is identical to the other.

14. The method of claim 11 wherein the plurality of output symbols includes an output symbol that when outputted indicates that an input symbol received during one cycle is identical to another input symbol that was received during an immediately preceding cycle.

15. The method of claim 11 wherein transitions between consecutive output symbols of the stream of output symbols correspond to transitions of a timing signal used to sample the outputted stream of output symbols.

16. The method of claim 11 wherein the plurality of output symbols includes a symbol that when outputted functions as a mask signal.

17. The method of claim 11 wherein the stream of provided outputted symbols are outputted as single-end signals.

18. The method of claim 11 wherein the stream of provided outputted signals are outputted as part of a memory interface.

19. The method of claim 18 wherein a symbol of the stream of input symbols corresponds to a portion of a memory data word.

20. The method of claim 19 further comprising outputting a second stream of output symbols selected from the plurality of output symbols, wherein an output symbol from the first stream of output symbols and an output symbol of the second stream of output symbols together represent a byte of a memory data word.

21. An apparatus for transmitting data, the apparatus comprising:
means for receiving a stream of input symbols selected from a plurality of input symbols;
means for selectively providing an output symbol corresponding to each received input symbol, each output symbol selected from a plurality of output symbols, each input symbol of the plurality of input symbols being represented by an output symbol of the plurality of output symbols;
means for outputting a stream of the provided output symbols so that no two consecutively outputted symbols are the same.

22. The apparatus of claim 21, wherein the plurality of output symbols are balanced equal weight output symbols.

23. The apparatus of claim 21, wherein the means for outputting a stream of provided output symbols selectively outputs two consecutive output symbols in response to a consecutive receiving of two identical input symbols, wherein one of the two consecutive output symbols is a symbol indicating that the one of the two consecutively received input symbols is identical to the other.

24. The apparatus of claim 21 wherein the plurality of output symbols includes an output symbol that when outputted indicates that an input symbol received during one cycle is identical to another input symbol that was received during an immediately preceding cycle.

25. The apparatus of claim 21 wherein transitions between consecutive output symbols of the stream of output symbols correspond to transitions of a timing signal used to sample the outputted stream of output symbols.

26. The apparatus of claim 21 wherein the plurality of output symbols includes a symbol that when outputted functions as a mask signal.

27. The apparatus of claim 21 wherein the means for outputting outputs the stream of provided outputted symbols as single-end signals.

28. The apparatus of claim 21 wherein the stream of provided outputted signals are outputted as part of a memory interface.

29. The apparatus of claim 28 wherein a symbol of the stream of input symbols corresponds to a portion of a memory data word.

30. The apparatus of claim 29 further comprising outputting a second stream of output symbols selected from the plurality of output symbols, wherein an output symbol from the first stream of output symbols and an output symbol of the second stream of output symbols together represent a byte of a memory data word.

31. A system, comprising:
a processor;
a memory;
an interleaving unit coupled to the memory; and
a memory controller coupled to the processor and the interleaving unit, the memory controller including a first encoder to receive a stream of N-bit symbols selected from a plurality of N-bit symbols and, in response, to selectively output to the interleaving unit a corresponding stream of M-bit symbols selected from a plurality of M-bit symbols, M being greater than N, each N-bit symbol of the plurality of N-bit symbols being associated with a corresponding M-bit symbol of the plurality of M-bit symbols, wherein no two consecutively outputted symbols of the stream of M-bit symbols are identical.

32. The system of claim 31 wherein the interleaving unit includes a decoder to decode a received M-bit symbol into the corresponding N-bit symbol.

33. The system of claim 31 wherein, in response to consecutively receiving two identical N-bit symbols, the first encoder to consecutively output two M-bit symbols selected from the plurality of M-bit symbols of which one is an output symbol indicating that the one: of the two consecutively received N-bit symbols is identical to the other.

34. The system of claim 31 wherein the plurality of M-bit symbols includes an M-bit symbol that when outputted by the first encoder indicates that a N-bit symbol received by the first encoder during one cycle is identical to another N-bit symbol that was received during an immediately preceding cycle.

35. The system of claim 31 wherein transitions between consecutive M-bit symbols of the stream of M-bit symbols correspond to transitions of a timing signal used to sample the outputted stream of M-bit symbols.

36. The system of claim 31 wherein the plurality of M-bit symbols includes a M-bit symbol that when outputted by the first encoder functions as a mask signal.

37. The system of claim 31 wherein the interleaving unit includes a second encoder that is substantially similar the first encoder of the memory controller, the second encoder to receive N-bit symbols selected from the plurality of N-bit symbols from the memory and to output corresponding M-bit symbols of the plurality of M-bit symbols to the memory controller, and wherein the memory controller includes a decoder to decode received M-bit symbols into corresponding N-bit signals.

38. The system of claim 37 wherein the interleaving unit includes a plurality of interleaving devices.

39. The system of claim 31 wherein the plurality of N-bit symbols corresponds to a portion of a memory data word.

40. The system of claim 39 wherein the memory controller further comprises a third encoder substantially similar to the first encoder, wherein a M-bit symbol from the first encoder and a M-bit symbol of the third encoder together represent a byte of a memory data word.

41. The system of claim 31 wherein the plurality of M-bit symbols are balanced equal weight symbols.

* * * * *